(12) United States Patent
Park

(10) Patent No.: US 7,158,427 B2
(45) Date of Patent: Jan. 2, 2007

(54) SEMICONDUCTOR MEMORY DEVICE

(75) Inventor: Mun Park, Kyeongki-Do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/907,872

(22) Filed: Apr. 19, 2005

(65) Prior Publication Data

US 2006/0233033 A1 Oct. 19, 2006

(30) Foreign Application Priority Data

Apr. 19, 2004 (KR) ...................... 10-2004-0026764

(51) Int. Cl.
*G11C 7/00* (2006.01)
(52) U.S. Cl. ...................... 365/203; 365/191
(58) Field of Classification Search .................. 365/203
See application file for complete search history.

(56) References Cited

U.S. PATENT DOCUMENTS 6,043,695 A * 3/2000 O'Sullivan .................. 327/157
6,711,229 B1  3/2004 Harada
2002/0186064 A1 * 12/2002 Ooishi ........................ 327/278

FOREIGN PATENT DOCUMENTS

| JP | 9082090 | 3/1997 |
| JP | 2003168292 | 6/2003 |
| JP | 2003297082 | 10/2003 |
| KR | 10-2002-0008878 | 2/2002 |

* cited by examiner

*Primary Examiner*—Thong Q. Le
(74) *Attorney, Agent, or Firm*—Marshall, Gerstein & Borun LLP

(57) ABSTRACT

A semiconductor memory device comprises a central control circuit for receiving an operation command from an external chipset, generating an active signal for executing the operation command, and generating a precharge signal after a predetermined time, a row path control circuit for controlling a bank according to the active signal or the precharge signal of the central control circuit, and a precharge time control circuit, which is enabled according to the active signal to output an oscillation signal having a predetermined frequency, divides the oscillation signal based on a setting time from when an active operation is performed until when a precharge operation is performed, and then outputs a precharge time control signal, thereby controlling generation of the precharge signal of the central control circuit.

11 Claims, 4 Drawing Sheets

SEMICONDUCTOR MEMORY DEVICE

FIELD OF THE INVENTION

The present invention relates to a semiconductor memory device, and more specifically, to a control circuit of a semiconductor memory device in which a minimum tRAS (Active to Precharge command period) being an AC parameter of a DRAM is controlled using an oscillator, whereby cell efficiency depending upon a reduction in the layout area is increased, instability of a tRAS setting value due to variation in existing inverter delay chain and RC delay is reduced, and operational characteristics are thus stabilized.

DISCUSSION OF RELATED ART

A precharge operation of a DRAM can include a case where after an active command is issued from an external chipset (application of a row address and a corresponding word line enable signal), a precharge operation command (application of a bit line precharge signal after disabling a word line) is applied, and a case where after an active operation command is issued, a precharge operation is automatically performed according to an DRAM internal signal after a predetermined time elapses through a delay stage within a DRAM. The latter is called auto-precharge. Generally, the auto-precharge operation includes write with auto-precharge and read with auto-precharge both of which are normal operations, and auto-refresh and self-refresh both of which are refresh operations.

If auto-precharge is performed, the precharge operation is performed after a predetermined delay time internally since the active operation command is issued. At this time, the delay time is set by a precharge time control circuit that delays a minimum tRAS (hereinafter, referred to as tRAS_min). An existing precharge time control circuit consists of an inverter delay chain or a RC delay. However, the delay circuit has instability in the tRAS setting value depending upon a process, a voltage and variation in temperature, and required a large layout area in order to implement a RC delay.

SUMMARY OF THE INVENTION

Accordingly, the present invention has been made in view of the above problems, and it is an object of the present invention to provide a control circuit of a semiconductor memory device in which an oscillator having a predetermined frequency is disposed within a DRAM, and the frequency of the oscillator is divided using a frequency divider according to a tRAS_min setting value, whereby tRAS_min of the value is guaranteed.

Another object of the present invention is to provide a semiconductor memory device in which the power supply within a DRAM having a constant electric potential while being less influenced by a process, a voltage and variation in a temperature is used as the power supply applied to an internal oscillator, and a test mode signal is applied as a periodic signal of the oscillator, thus changing an oscillation cycle.

Still another object of the present invention is to provide a control circuit of a semiconductor memory device in which if a DRAM enters a power-down mode, a power-down signal is applied to an oscillator to extend the cycle of the oscillator, thereby reducing power consumption of the DRAM.

To achieve the above object, according to the present invention, there is provided a control circuit of a semiconductor memory device, comprising a central control circuit for receiving an operation command from an external chipset, generating an active signal for executing the operation command, and generating a precharge signal after a predetermined time, a row path control circuit for controlling a bank according to the active signal or the precharge signal of the central control circuit, and a precharge time control circuit enabled according to the active signal to output an oscillation signal having a predetermined frequency, for dividing the oscillation signal based on a setting time until a precharge operation is performed after an active operation and outputting a precharge time control signal, thus controlling generation of the precharge signal of the central control circuit.

The precharge time control circuit comprises an oscillator for generating an oscillation enable signal according to the active signal, and outputting a controlled oscillation signal according to a plurality of test mode oscillation signals and a power-down signal, a frequency divider, which is driven according to the oscillation enable signal to divide the oscillation signal according to the setting time from when the active operation is performed until when the precharge operation is performed, and a pulse generator for generating the precharge time control signal using the signal divided through the frequency divider.

The oscillator comprises a flip-flop for outputting the oscillation enable signal according to the active signal and the precharge time control signal, logic means for outputting the oscillation signal according to the oscillation enable signal, and a cycle controller for controlling the cycle of the oscillation signal that is received from the logic means according to the plurality of the test mode oscillation signals and the power-down signal.

The logic means comprises NAND gates for inverting the oscillation signal according to the oscillation enable signal, and inverters for inverting an output signal of the NAND gate.

The cycle controller comprises a plurality of delay means for delaying the oscillation signal, and a plurality of switching means respectively connected to output terminals of the plurality of the delay means, the switching means being driven according to the plurality of the test mode oscillation signals and the power-down signal to set a delay path of the oscillation signal.

The last switching means among the plurality of the switching means is driven according to the power-down signal.

The switching means comprises a plurality of inverters for inverting the plurality of the test mode oscillation signals and the power-down signal, respectively, and a plurality of transfer gates respectively driven according to the plurality of the test mode oscillation signals and the power-down signal, and output signals of the plurality of the inverters.

The frequency divider comprises the frequency divider comprises a plurality of frequency diving units driven according to the oscillation enable signal, for dividing the oscillation signal based on the setting time until the precharge operation is performed after the active operation, wherein the frequency dividing unit of a foremost stage divides the oscillation signal, and the frequency dividing unit of a latter stage divides the oscillation signal, which has been divided by the frequency divider of a previous stage once more.

The frequency dividing unit comprises a first transfer gate for transferring the divided signal according to the oscillation signal, a first latch for latching the divided signal received from the first transfer gate according to the oscillation enable signal, a second transfer gate driven according to the oscillation signal in a complementary manner together with the first transfer gate, for transferring the signal latched in the first latch, and a second latch for latching the signal received from the second transfer gate and then outputting the divided signal.

The first latch comprises a NAND gate for inverting the divided signal received from the first transfer gate according to the oscillation enable signal, and an inverter for inverting the output signal of the NAND gate, and again inputting the inverted signal to the NAND gate.

The pulse generator comprises a plurality of inverters for inverting and delaying an output signal of the frequency divider, and a NOR gate for outputting the precharge time control signal using the output signal of the plurality of the inverters and the output signal of the frequency divider.

DETAILED DESCRIPTION OF PREFERRED EMBODIMENTS

Now, the preferred embodiments according to the present invention will be described with reference to the accompanying drawings.

Figure 1:
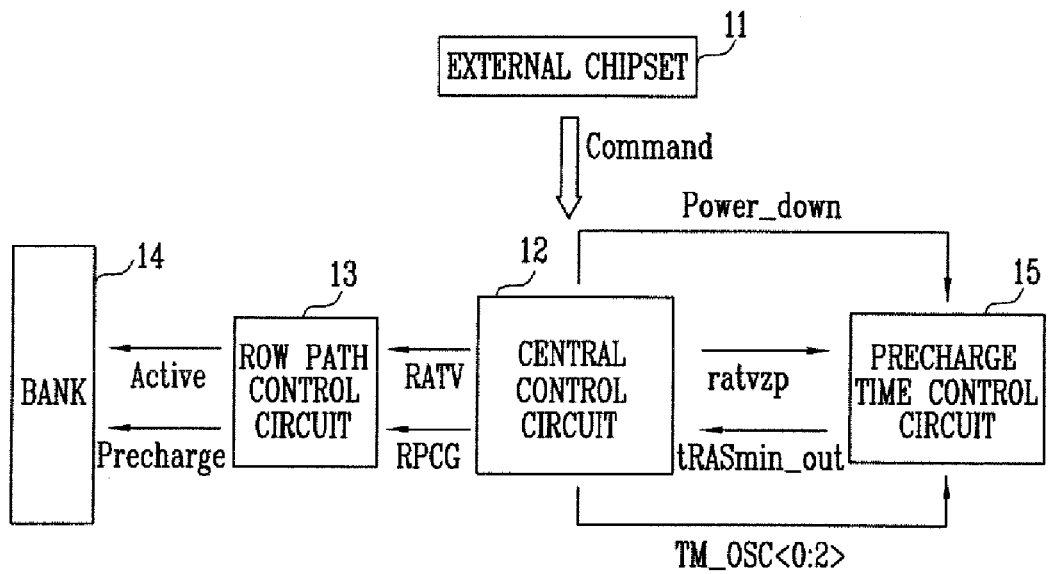
FIG. 1 is a block diagram illustrating the construction of a control circuit of a semiconductor memory device according to the present invention.

FIG. 1 is a block diagram illustrating the construction of a control circuit of a semiconductor memory device according to the present invention.

If a command such as write with auto-precharge, read with auto-precharge or auto refresh is issued from an external chipset 11, a central control circuit 12 of a DRAM applies an active pulse ratvzp to a precharge time control circuit 15 while applying an active signal RATV for performing this command to a row path control circuit 13. The row path control circuit 13 that has received the active signal RATV inputs an active command Active to a corresponding bank 14. According to the active command Active, a corresponding block and cell are selected. Meanwhile, the precharge time control circuit 15 includes an oscillator, a frequency divider and a pulse generator. The oscillator that has received the active pulse ratvzp is enabled by an oscillation enable signal OSC_en, thus starting oscillation having a predetermined frequency. An oscillation signal OSC_out outputted from the oscillator is inputted to the frequency divider. The frequency divider divides the oscillation signal OSC_out so that it has a value suitable for a tRAS_min setting value, and then inputs the divided signal to the pulse generator. The pulse generator that has received the finally divided signal from the frequency divider outputs a precharge time control signal tRASmin_out indicating that the tRAS_min is guaranteed to the central control circuit δ 2 and the oscillator. As the oscillation enable signal OSC_en is disabled in the oscillator that has received the precharge time control signal tRASmin_out, the oscillator and the frequency divider are disabled. Further, the central control circuit 12 combines the precharge time control signal tRASmin_out with a signal related to an auto-precharge operation and then inputs a precharge signal RPCG to the row path control circuit 13. The row path control circuit 13 applies a precharge command Precharge to the bank 14.

Figure 2:
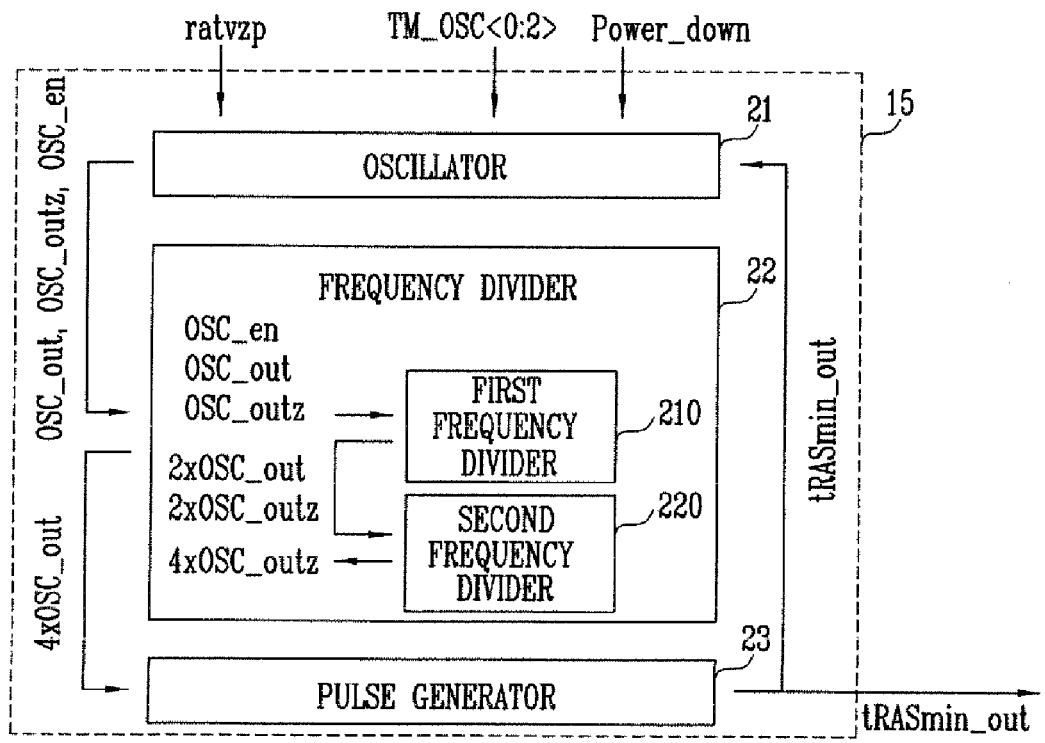
FIG. 2 is a detailed block diagram of a precharge time control circuit that constitutes the control circuit shown in FIG. 1 according to the present invention.

FIG. 2 is a detailed block diagram of the precharge time control circuit 15 constituting the control circuit of FIG. 1 according to the present invention.

The precharge time control circuit 15 includes an oscillator 21, a frequency divider 22 and a pulse generator 23. The oscillator 21 receives an active pulse ratvzp, test mode oscillation signals TM_OSC<0:2> and a power-down signal Power_down from the central control circuit 12. The oscillator 21 that has received the active pulse ratvzp generates an oscillation enable signal OSC_en to enable the frequency divider 22. The oscillator 21 also outputs a controlled oscillation signal OSC_out according to the test mode oscillation signals TM_OSC<0:2> and the power-down signal Power_down. At this time, the test mode oscillation signals TM_OSC<0:2> are inputted to a cycle controller, which constitutes the oscillator 21, to control the cycle of the oscillator depending upon an operation condition. Further, the power-down signal Power_down is used to extend the cycle of the oscillator 21 by maximum when a DRAM enters a power-down mode, thereby reducing power consumption. The oscillation signal OSC_out outputted from the oscillator 21 is a signal having a constant frequency and is inputted to the frequency divider 22. The frequency divider 22 divides the oscillation signal OSC_out into values suitable for a tRAS_min setting value. In this embodiment, the frequency divider 22 includes a first frequency divider 210 that divides the oscillation signal OSC_out by 2, and a second frequency divider 220 that divides the oscillation signal OSC_out by 4. A 4-divided output signal 4×OSC_out, which has been divided twice so as to be suitable for the tRAS_min setting value, is inputted to the pulse generator 23. The pulse generator 23 outputs a precharge time control signal tRASmin_out according to the 4-divided output signal 4×OSC_out. The precharge time control signal tRASmin_out is inputted to the central control circuit 12 and the oscillator 21.

Figure 3:
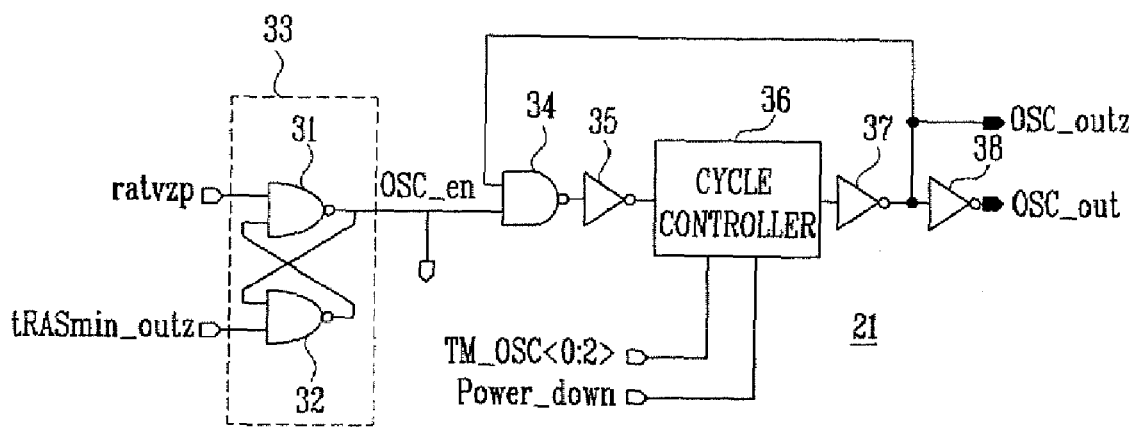
FIG. 3 is a detailed circuit diagram of an oscillator shown in FIG. 2.

FIG. 3 is a detailed circuit diagram of the oscillator 21 constituting the precharge time control circuit 15 of FIG. 2.

A first NAND gate 31 receives an active pulse ratvzp and an output signal of a second NAND gate 32. The second NAND gate 32 receives a delay bar signal tRASmin_outz, which is generated by inverting a precharge time control signal tRASmin_out, and an output signal of the first NAND gate 31. The first and second NAND gates 31 and 32 constitute a flip-flop 33. An output signal of the flip-flop 33 is inputted to a third NAND gate 34 and is also outputted to the frequency divider 22 as an oscillation enable signal OSC_en. The third NAND gate 34 receives the oscillation enable signal OSC_en being the output signal of the flip-flop 33 and an oscillation bar signal OSC_outz being an output signal of a second inverter 37. An output signal of the third NAND gate 34 is inverted by a first inverter 35 and is then inputted to a cycle controller 36. The cycle controller 36 receives an output signal of the first inverter 35, test mode oscillation signals TM_OSC<0:2> and a power-down signal Power_down, and then controls the cycle of the oscillator depending upon an operation condition. If a DRAM enters a power-down mode, the cycle controller 36 extends the cycle of the oscillator by maximum, thereby reducing power consumption. The output signal as the oscillation bar signal OSC_outz of the cycle controller 36 is inverted by the second inverter 37 and is then inputted to the third NAND gate 34. The output signal of the cycle controller 36 is inverted again by a third inverter 38 to generate an oscillation signal OSC_out. The oscillation signal OSC_out and the oscillation bar signal OSC_outz are inputted to the frequency divider 22.

A method of driving the oscillator constructed above will now be described.

If the active pulse ratvzt is enabled to a logic LOW state, the flip-flop 33 outputs the oscillation enable signal OSC_en of a logic HIGH state. If the oscillation enable signal OSC_en of the logic HIGH state is inputted to the third NAND gate 34, the oscillator 21 starts oscillation since the output of the inverter 37 is fed back to the third NAND gate. The cycle controller 36 receives the output signal of the first inverter 35 and controls its output according to the test mode oscillation signals TM_OSC<0:2>, thus controlling the oscillation cycle. The cycle controller 36 also extends the oscillation cycle to maximum cycle when a DRAM enters a power-down mode according to the power-down signal power_down, thereby reducing power consumption. The output signal of the cycle controller 36 is inverted by the second inverter 37, inverted again by the third inverter 38 to generate the oscillation signal OSC_out. At this time, the oscillation bar signal OSC_outz being the output signal of the second inverter 37 is inputted to the third NAND gate 34, and the oscillation bar signal OSC_outz and the oscillation signal OSC_out are inputted to the frequency divider 22. Meanwhile, the oscillator 21 inputs the delay bar signal tRASmin_outz, which is inverted from the precharge time control signal tRASmin_out that is finally divided and then outputted from the pulse generator 23, to the second NAND gate 32 of the flip-flop 33, thus disabling the oscillation enable signal OSC_en to a logic LOW state. The oscillator 21 and the frequency divider 22 are thus disabled.

Figure 4:
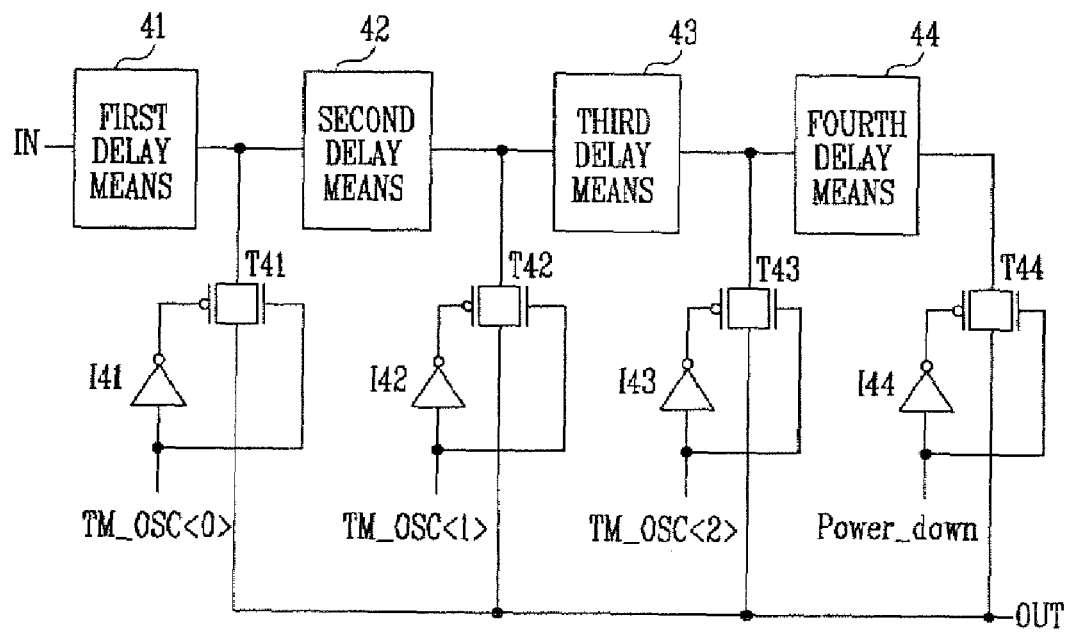
FIG. 4 is a detailed circuit diagram of a cycle controller shown in FIG. 3.

FIG. 4 is a detailed circuit diagram of the cycle controller constituting the oscillator 21 of FIG. 3.

The cycle controller applied to the oscillator includes a plurality of delay means 41 to 44 serially connected, for delaying an input signal IN, and transfer gates T41 to T44 driven according to test mode oscillation signals TM_OSC<0:2> and a power-down signal Power_down, and signals inverted by inverters I41 to I44, for deciding a delay path.

In the cycle controller constructed above, an oscillation cycle can be changed depending upon external operating environment, a process, a voltage, variation in temperature and/or the like. In order to tune this, it is required that a delay path be decided according to the test mode oscillation signals TM_OSC<0:2>, and power consumption be minimized when a DRAM enters a power-down mode. To this end, the delay path is decided according to a power-down signal Power_down, and an output signal out is then outputted. For example, if the test mode oscillation signal TM_OSC<1> is applied as a logic HIGH state and the remaining signals are applied as a logic LOW state, the second transfer gate T42 is turned on by means of the test mode oscillation signal TM_OSC<1> of the logic HIGH state and a signal that is inverted into a logic LOW state by means of the second inverter I42. Therefore, the input signal IN is delayed through the first and second delay means 41 and 42, and the delay signal is thus outputted as the output signal out.

Meanwhile, if the power-down signal Power_down is applied as a logic HIGH state and the remaining test mode oscillation signals TM_OSC<0:2> are applied as a logic LOW state since a DRAM enters the power-down mode, the fourth transfer gate T44 is turned on by means of the power-down signal Power_down of the logic HIGH state and a signal that is inverted into a logic LOW state by means of the fourth inverter I44. Accordingly, the input signal IN is delayed through the first to fourth delay means 41 to 44, and the delay signal is thus outputted as the output signal out. As such, the oscillation cycle is extended to maximum cycle and power consumption is thus reduced.

Figure 5:
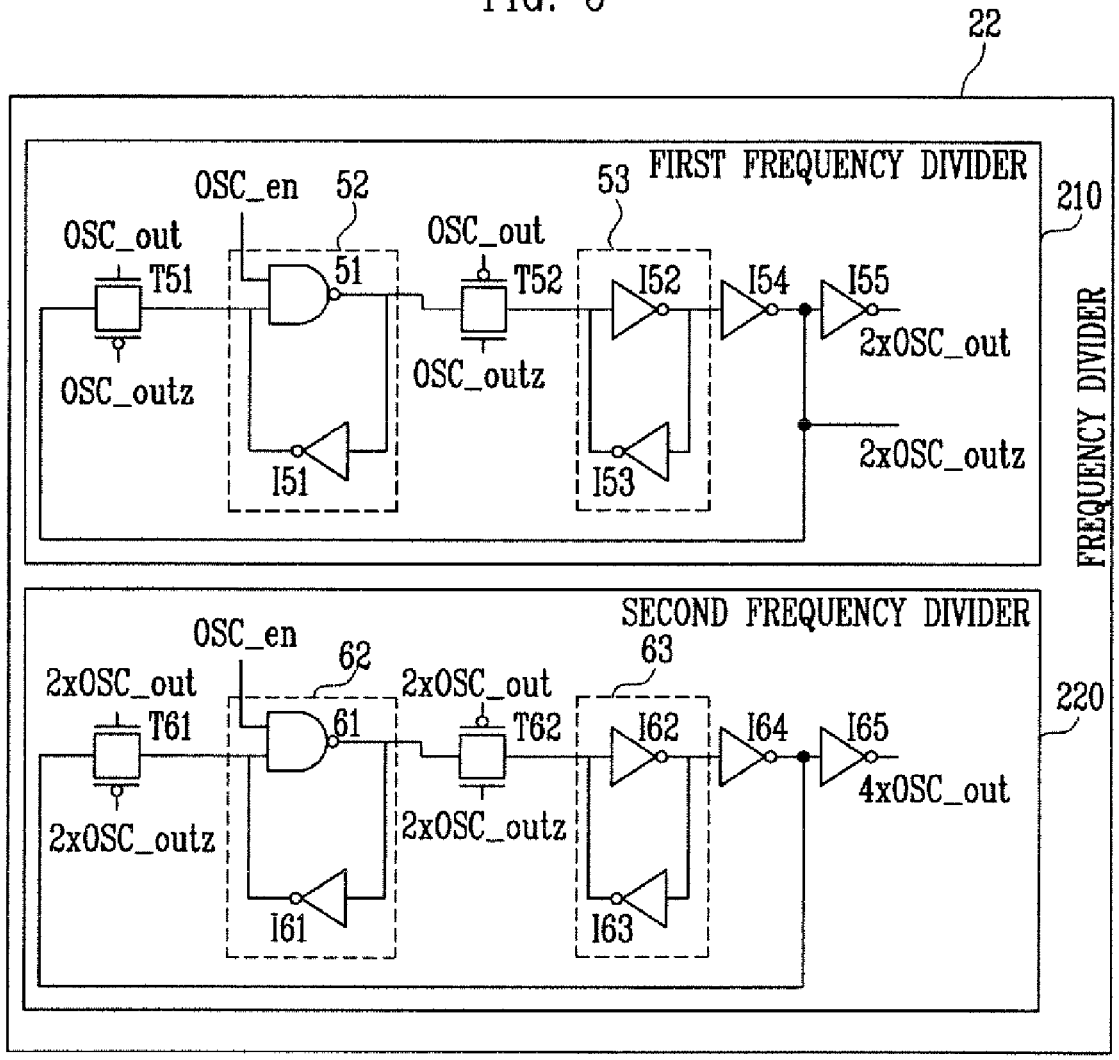
FIG. 5 is a detailed circuit diagram of a frequency divider shown in FIG. 2.

FIG. 5 is a detailed circuit diagram of the frequency divider 22 shown in FIG. 2 according to the present invention.

The frequency divider divides the oscillation signal OSC_out by 2, 4 or a value suitable for a tRAS_min setting value. In this embodiment, a case where the frequency divider includes the first frequency divider 210 that divides the oscillation signal OSC_out by 2 and the second frequency divider 220 that divides the oscillation signal OSC_out by 4 will be described.

The construction of the first frequency divider 210 will be first described. A first transfer gate T51 is driven according to an oscillation signal OSC_out being an output signal of an oscillator and its inverted signal OSC_outz, and thus transfers a 2-divided oscillation bar signal 2×OSC_outz being an output signal of the first frequency divider 210. A first latch 52 latches the signal received from the first transfer gate T51 according to an oscillation enable signal OSC_en. A NAND gate 51 inverts the signal received from the first transfer gate T51 according to the oscillation enable signal OSC_en. A first inverter I51 inverts the output signal of the NAND gate 51 and again inputs the inverted signal to the NAND gate 51. A second transfer gate T52 is driven according to the oscillation signal OSC_out and its inverted signal OSC_outz, in which the second transfer gate T52 is driven in opposite to the first transfer gate T51, and thus transfers the output signal of the first latch 52. A second latch 53 having second and third inverters I52 and I53 latches the signal received from the second transfer gate T52. A fourth inverter I54 inverts the output signal of the second latch 53 and then outputs a 2-divided oscillation bar signal 2×OSC_outz. This signal is transferred through the first transfer gate T51. A fifth inverter I55 inverts the 2-divided oscillation bar signal 2×OSC_outz and then outputs a 2-divided oscillation signal 2×OSC_out.

The construction of the second frequency divider 220 will now be described. A first transfer gate T61 is driven according to a 2-divided oscillation signal 2×OSC_out and its inverted signal 2×OSC_outz both of which are outputted to the first frequency divider 210, and thus transfers a 4-divided oscillation bar signal 4×OSC_outz being an output signal of the second frequency divider 220. A first latch 62 serves to latch the signal received from the first transfer gate T61 according to an oscillation enable signal OSC_en. A NAND gate 61 inverts the signal received from the first transfer gate T61 according to the oscillation enable signal OSC_en. A first inverter I61 inverts the output signal of the NAND gate 61 and again inputs the inverted output signal to the NAND gate 61. A second transfer gate T62 is driven in a opposite to the first transfer gate T61 according to the 2-divided oscillation signal 2×OSC_out and its inverted signal 2×OSC_outz, and then transfers the output signal of the first latch 62. A second latch 63 consisting of second and third inverters I62 and I63 latches the signal received from the second transfer gate T62. A fourth inverter I64 inverts the output signal of the second latch 63, and then outputs a 4-divided oscillation bar signal 6×OSC_outz. This signal is transferred through the first transfer gate T61. A fifth inverter I65 inverts the 4-divided oscillation bar signal 4×OSC_outz and outputs a 4-divided oscillation signal 4×OSC_out. The 4-divided oscillation signal 4×OSC_out is used as an input signal of the pulse generator.

The frequency divider constructed above according to the present invention increases the cycle of the oscillation signal OSC_out from the oscillator two or four times, and outputs the signal divided thus to the pulse generator. At this time, the frequency divider sets the number of frequency dividing units so as to be suitable for a range to be divided. For example, if the cycle is to be extended four times, two frequency diving units can be used.

A method of driving the first frequency divider 210 will be below described. If the oscillation signal OSC_out is applied as a logic HIGH state and its inverted signal OSC_outz is applied as a logic LOW state, the first transfer gate T51 is turned on to transfer the 2-divided oscillation bar signal 2×OSC_outz. Since the oscillation enable signal OSC_en is applied as a logic HIGH state, the first latch 52 having the NAND gate 51 and the first inverter I51 latches the signal received from the first transfer gate T51. Thereafter, if the oscillation signal OSC_out is applied as a logic LOW state and its inverted signal OSC_outz is applied as a logic HIGH state, the second transfer gate T52 is turned on to transfer the signal latched in the first latch 52. The signal transferred through the second transfer gate T52 is latched in the second latch 53 having the second and third inverters I52 and I53. The signal latched in the second latch 53 is inverted by means of the fourth inverter I54 and then outputted as the 2-divided oscillation bar signal 2×OSC_outz. The 2-divided oscillation bar signal 2×OSC_outz is inverted by means of the fifth inverter I55 and then outputted as the 2-divided oscillation signal 2×OSC_out. The 2-divided oscillation signal 2×OSC_out and the 2-divided oscillation bar signal 2×OSC_out are inputted to the 4-divided frequency divider 220.

A method of driving the second frequency divider 220 will now be described. If the 2-divided oscillation signal 2×OSC_out is applied as a logic HIGH state and its inverted signal 2×OSC_outz is applied as a logic LOW state, the first transfer gate T61 is turned on to transfer the 4-divided oscillation bar signal 4×OSC_outz. If the oscillation enable signal OSC_en is applied as a logic HIGH state, the first latch 62 having the NAND gate 61 and the first inverter I61 latches the signal received from the first transfer gate T61. Thereafter, if the 2-divided oscillation signal 2×OSC_out is applied as a logic LOW state and its inverted signal 2×OSC_outz is applied as a logic HIGH state, the second transfer gate T62 is turned on to transfer the signal latched in the first latch 62. The signal transferred through the second transfer gate T62 is latched in the second latch 63 having the second and third inverters I62 and I63. The signal latched in the second latch 63 is inverted by means of the fourth inverter I64 and then outputted as the 4-divided oscillation bar signal 4×OSC_outz. The 4-divided oscillation bar signal 4×OSC_outz is inverted by means of the fifth inverter I45 and then outputted as the 4-divided oscillation signal 4×OSC_out. The 4-divided oscillation signal 4×OSC_out is inputted to the pulse generator.

Figure 6:
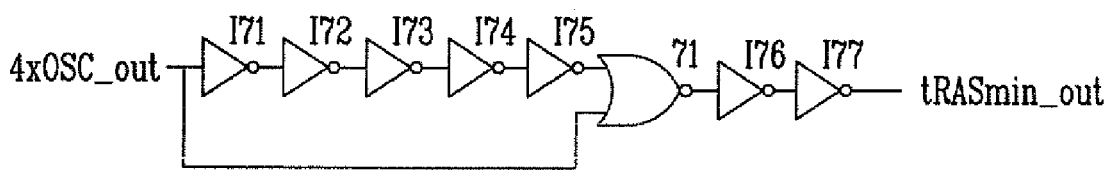
FIG. 6 is a detailed circuit diagram of a pulse generator shown in FIG. 2.

FIG. 6 is a detailed circuit diagram of the pulse generator 23 shown in FIG. 2. A plurality of inverters I71 to I75 invert and delay the output signal 4×OSC_out of the frequency divider, which has been divided by 4. A NOR gate 71 receives the signal, which has been inverted and delayed through the plurality of the inverters I71 to I75 and the output signal 4×OSC_out of the frequency divider. The output signal of the NOR gate 71 is outputted as a precharge time control signal tRASmin_out through sixth and seventh inverters I76 and I77. The precharge time control signal tRASmin_out is inputted to the oscillator while being inputted to the central control circuit, thereby disabling the oscillator.

Figure 7:
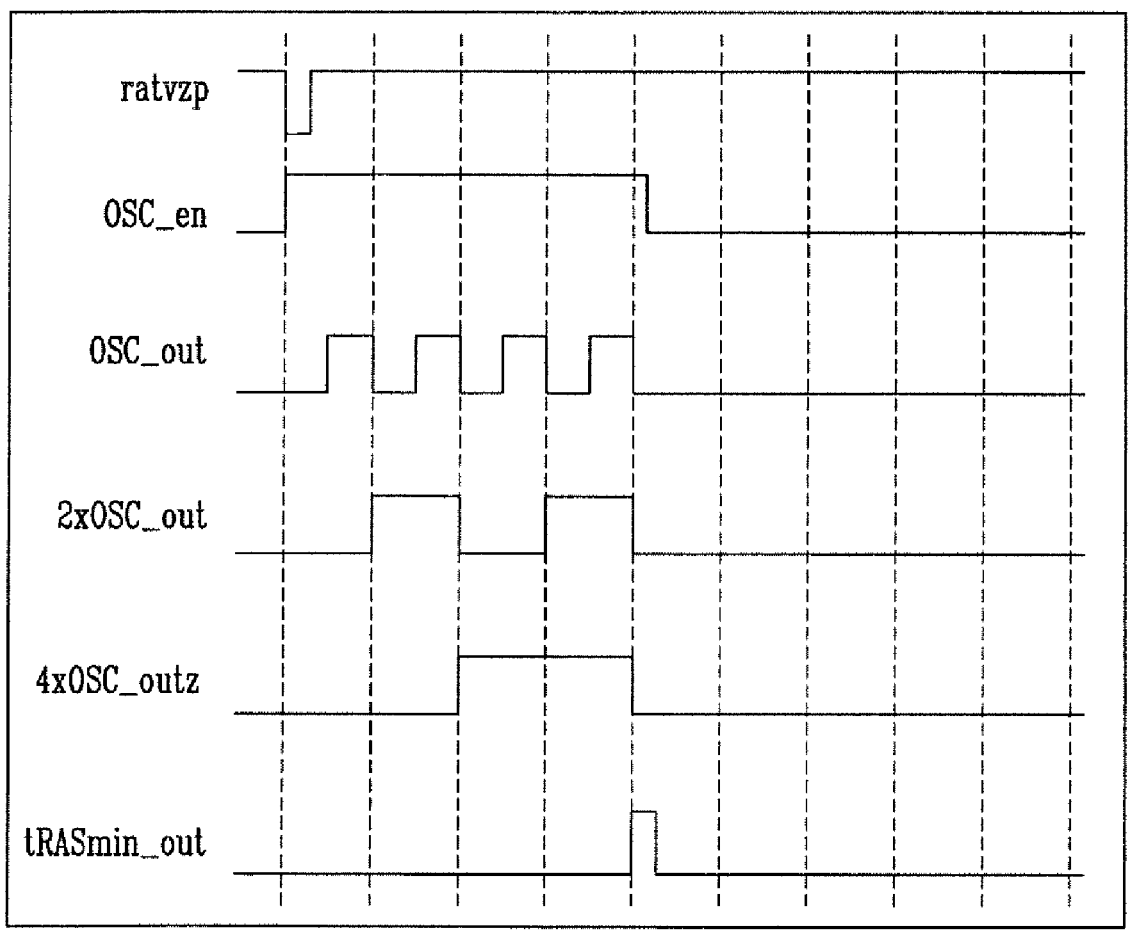
FIG. 7 shows a driving waveform of the precharge time control circuit constituting the control circuit of the semiconductor memory device according to the present invention.

FIG. 7 shows a driving waveform of the control circuit of the semiconductor memory device according to the present invention.

It is first assumed that tRAS_min is 45 ns. If an active pulse ratvzp is enabled to a logic LOW state, an oscillation enable signal OSC_en is outputted as a logic HIGH state from the oscillator 21. The oscillator 21 and the frequency divider 22 are thus disabled. Assuming that an oscillation cycle of the oscillator 21 is 10 ns, the oscillation signal OSC_out is toggled four times and is inputted to the frequency divider 22. The oscillation signal OSC_out is divided by means of the first frequency divider 210 of the frequency divider 22, thus generating a 2-divided oscillation signal 2×OSC_out. The oscillation signal OSC_out is divided once more by means of the second frequency divider 220, thus generating a 4-divided oscillation signal 4×OSC_out. As such, if the oscillation signal OSC_out is divided twice, the pulse generator 23 generates a precharge time control signal tRASmin_out indicating that tRAS_min is guaranteed by inputting the 4-divided oscillation signal 4×OSC_out after approximately 40 ns. The precharge time control signal tRASmin_out is inputted to the central control circuit 12, thus generating a precharge signal, and is also inputted to the oscillator 21, thus making the oscillation enable signal OSC_en a logic LOW state. Accordingly, the oscillator 21 and the frequency divider 22 are disabled. However, the reason why the precharge time control signal tRASmin_out is generated after the delay time of 40 ns, which is smaller than a setting value of about 5 ns, is to consider a delay time depending upon generation of internal signals. For example, if the margin of an internal signal generating time is 10 ns, 45 ns can be guaranteed by designing the cycle of the oscillator to be 9 ns.

As described above, according to the present invention, tRAS_min being an AC parameter of a DRAM is controlled using an oscillator. Thus, cell efficiency depending upon reduction in the layout area can be increased, and instability of tRAS_min due to variation in existing inverter delay chain and RC delay depending upon a process, a voltage and variation in temperature can be reduced. Accordingly, the present invention is advantageous in that it can stabilize operational characteristics.

Although the foregoing description has been made with reference to the preferred embodiments, it is to be understood that changes and modifications of the present invention may be made by the ordinary skilled in the art without departing from the spirit and scope of the present invention and appended claims.

What is claimed as new and desired to be protected by Letters Patent of the United States is:

1. A semiconductor memory device, comprising:
 a central control circuit for receiving an operation command from an external chipset, generating an active signal for executing the operation command, and generating a precharge signal after a predetermined time;
a row path control circuit for controlling a bank according to the active signal or the precharge signal of the central control circuit; and
a precharge time control circuit enabled according to the active signal to output an oscillation signal having a predetermined frequency, for dividing the oscillation signal based on a setting time until a precharge operation is performed after an active operation and outputting a precharge time control signal, thus controlling generation of the precharge signal of the central control circuit.

2. The semiconductor memory device as claimed in claim 1, wherein the precharge time control circuit comprises:
an oscillator for generating an oscillation enable signal according to the active signal, and outputting a controlled oscillation signal according to a plurality of test mode oscillation signals and a power-down signal;
a frequency divider driven according to the oscillation enable signal, for controlling and dividing the oscillation signal based on a setting time until the precharge operation is performed after the active operation; and
a pulse generator for generating the precharge time control signal using the signal divided through the frequency divider.

3. The semiconductor memory device as claimed in claim 2, wherein the oscillator comprises:
a flip-flop for outputting the oscillation enable signal according to the active signal and the precharge time control signal;
logic means for outputting the oscillation signal according to the oscillation enable signal; and
a cycle controller for controlling the cycle of the oscillation signal that is received from the logic means according to the plurality of the test mode oscillation signals and the power-down signal.

4. The semiconductor memory device as claimed in claim 3, wherein the logic means comprises:
NAND gates for inverting the oscillation signal according to the oscillation enable signal; and
an inverter for inverting the output signal of the NAND gate.

5. The semiconductor memory device as claimed in claim 3, wherein the cycle controller comprises:
a plurality of delay means for delaying the oscillation signal; and
a plurality of switching means respectively connected to output terminals of the plurality of the delay means, wherein the switching means are driven according to the plurality of the test mode oscillation signals and the power-down signal to set a delay path of the oscillation signal.

6. The semiconductor memory device as claimed in claim 5, wherein the last switching means among the plurality of the switching means is driven according to the power-down signal.

7. The semiconductor memory device as claimed in claim 5, wherein the switching means comprises:
a plurality of inverters for inverting the plurality of the test mode oscillation signals and the power-down signal, respectively; and
a plurality of transfer gates respectively driven according to the plurality of the test mode oscillation signals and the power-down signal, and output signals of the plurality of the inverters.

8. The semiconductor memory device as claimed in claim 2, wherein the frequency divider comprises a plurality of frequency diving units driven according to the oscillation enable signal, for dividing the oscillation signal based on the setting time until the precharge operation is performed after the active operation, wherein the frequency dividing unit of a foremost stage divides the oscillation signal, and the frequency dividing unit of a latter stage divides the oscillation signal, which has been divided by the frequency divider of a previous stage once more.

9. The semiconductor memory device as claimed in claim 8, wherein the frequency dividing unit comprises:
a first transfer gate for transferring the divided signal according to the oscillation signal;
a first latch for latching the divided signal received from the first transfer gate according to the oscillation enable signal;
a second transfer gate driven according to the oscillation signal in a complementary way together with the first transfer gate, for transferring the signal latched in the first latch; and
a second latch for latching the signal received from the second transfer gate and then outputting the divided signal.

10. The semiconductor memory device as claimed in claim 9, wherein the first latch comprises:
a NAND gate for inverting the divided signal received from the first transfer gate according to the oscillation enable signal; and
an inverter for inverting the output signal of the NAND gate, and again inputting the inverted signal to the NAND gate.

11. The semiconductor memory device as claimed in claim 2, wherein the pulse generator comprises:
a plurality of inverters for inverting and delaying an output signal of the frequency divider; and
a NOR gate for outputting the precharge time control signal using the output signal of the plurality of the inverters and the output signal of the frequency divider.

* * * * *